United States Patent
Watanabe et al.

[11] Patent Number: 5,863,602
[45] Date of Patent: Jan. 26, 1999

[54] METHOD FOR CAPTURING GASEOUS IMPURITIES AND SEMICONDUCTOR DEVICE MANUFACTURING APPARATUS

[75] Inventors: Hirohito Watanabe; Toshiyuki Hirota; Takashi Ogawa, all of Tokyo, Japan

[73] Assignee: NEC Corporation, Tokyo, Japan

[21] Appl. No.: 862,398

[22] Filed: May 23, 1997

[30] Foreign Application Priority Data

Jun. 3, 1996 [JP] Japan .................................. 8-140272

[51] Int. Cl.⁶ .................................................. C23C 16/24
[52] U.S. Cl. ........................................ 427/237; 427/248.1
[58] Field of Search ................................ 427/230, 237, 427/238, 239, 248.1, 578

[56] References Cited

U.S. PATENT DOCUMENTS

| | | | |
|---|---|---|---|
| 4,428,975 | 1/1984 | Dahm et al. | 427/94 |
| 4,650,698 | 3/1987 | Moriya et al. | 427/237 |
| 5,663,090 | 9/1997 | Dennison et al. | 438/398 |

FOREIGN PATENT DOCUMENTS

| | | |
|---|---|---|
| 0 648 858 A1 | 4/1995 | European Pat. Off. . |
| 60-010621 | 1/1985 | Japan . |
| 1-197388 | 8/1989 | Japan . |
| 5-206046 | 8/1993 | Japan . |
| 08306646 A | 11/1996 | Japan . |

OTHER PUBLICATIONS

British Search Report dated Aug. 19, 1997.

*Primary Examiner*—Shrive Beck
*Assistant Examiner*—Timothy Meeks
*Attorney, Agent, or Firm*—Whitham, Curtis & Whitham

[57] ABSTRACT

Before an HSG-Si film is formed, silicon films are pre-coated on the inner wall of a reaction chamber (12) for forming the HSG-Si film on a wafer (14) and in a boat (25) which is used for accommodate and support the wafer (14) in the reaction chamber (12), and then the wafer (14) is fed into the pre-coated reaction chamber (12) to form the HSG-Si film in the state that impurities on the wafer (14) have been removed. By pre-coating the silicon films, the impurities such as water, oxygen, hydrocarbon and organic materials can be removed, and a surface area increase rate of the HSG-Si film formed on the wafer (14) can be improved.

7 Claims, 10 Drawing Sheets

F I G. 10A
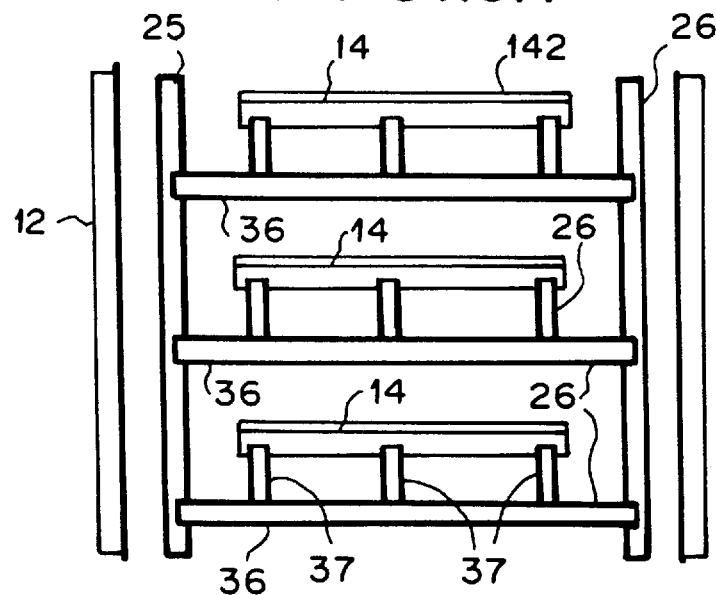
F I G. 10B
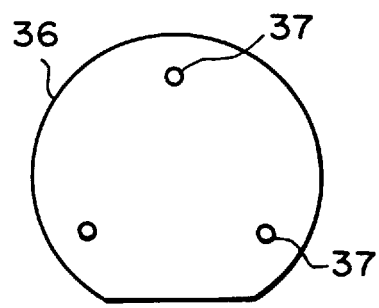
F I G. 10C
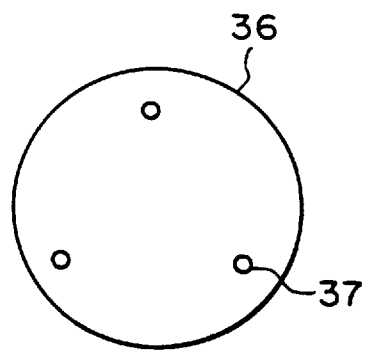

F I G.11A
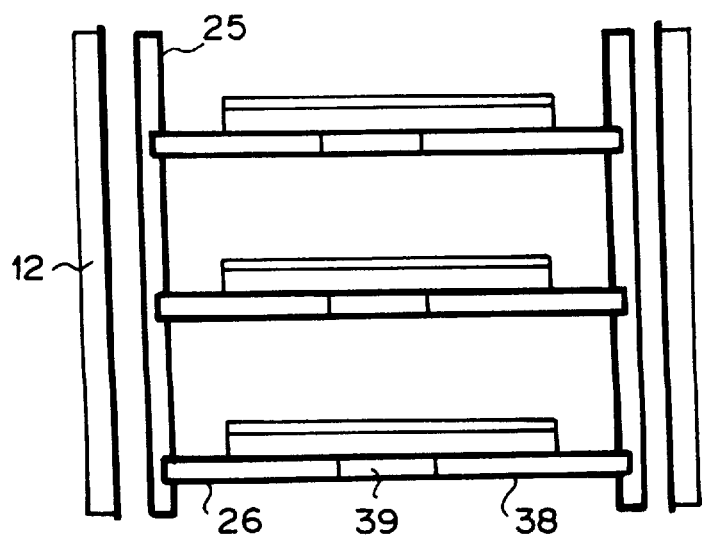
F I G.11B
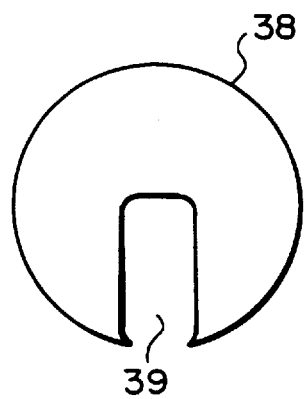

METHOD FOR CAPTURING GASEOUS IMPURITIES AND SEMICONDUCTOR DEVICE MANUFACTURING APPARATUS

BACKGROUND OF THE INVENTION

1. Field of the Invention

The present invention relates to a gaseous-impurities capturing method which is used to capture gaseous impurities in a semiconductor device manufacturing process, and an apparatus for manufacturing a semiconductor device by using the capturing method.

2. Description of the Related Art

Recently, higher integration design has been required for semiconductor devices such as semiconductor memories (for example, dynamic RAM (hereinafter referred to as DRAM), etc., and in order to meet this requirement, the area which is indispensable to each memory cell has been extremely reduced. For example, in the case of 1 MDRAM or 4 MDRAM, a design rule for providing the minimum design width of 0.8 micrometer is adopted. On the other hand, in the case of 16 MDRAM, a design rule for providing the minimum design width of 0.6 micrometer is adopted. As the area of the memory cell is reduced as described above, the amount of charges accumulated in the memory cell is also reduced, and thus it is difficult to ensure the charge amount which is required for the memory cell in accordance with the high integration design.

On the other hand, in order to ensure the charge amount required for the memory cell, a memory cell having a trench type or laminate type capacitor has been proposed and used in practice.

A memory cell structure having a laminate type capacitor has an advantage that it has higher resistance to a soft error than a memory call structure having a trench type capacitor, and also an advantage that it causes no damage to a silicon substrate. Therefore, the memory cell structure having the laminate type capacitor has been expected as a memory cell structure of the next generation. Further, it has been considered that the resistance to alpha ray is enhanced by designing a trench capacitor in the laminate type trench structure. Accordingly, the laminate type memory call is promising as a next generation technique.

In such a situation, there has been proposed an application of an HSG (hemi-spherical-grain) technique to a laminate type capacitor which is applicable to DRAMs of 64 Mbytes or more (as disclosed in Japanese laid-open Patent Application No. Hei-8-306646). According to the HSG technique, a large number of hemi-spherical grains or mushroom-shaped grains are formed on the surface of a storage electrode of a capacitor to substantially increase the surface area of the storage electrode and thus achieve a large capacity.

When the storage electrode as described above is formed, silicon-contained gas such as $SiH_4$ or the like is irradiated onto a deposited amorphous silicon layer to arrange silicon atoms serving as nucleuses on the layer, and after the irradiation, the silicon atoms located around the nucleuses are collected with the thus-formed nucleuses at the center, whereby uneven particles, that is, hemi-spherical or mushroom-shaped grains are formed on the surface. The film having the hemi-spherical or mushroom-shaped grains becomes a polysilicon film as a result, and in the following description, the layer having the hemi-spherical or mushroom-shaped grains is hereinafter referred to as "HSG-Si film".

In the case where the hemi-spherical grains are formed on amorphous silicon as described above, if a natural oxide film of several atom layers or the like is formed on the surface of amorphous silicon, the oxygen atoms of the natural oxide film disturb migration of Si atoms, and thus disable the formation of hemi-spherical grains. Actually, a silicon oxide film as a natural oxide film is formed on amorphous silicon even under such a condition that the partial pressure of oxygen is equal to about $1 \times 10^{-6}$ Torr. Therefore, impurities such as oxygen, water, etc. must be prevented from remaining in the atmosphere during the process of forming the hemi-spherical grains.

In order to solve the above problem, the Japanese patent application described above discloses a method of treating a natural oxide film formed on amorphous silicon with hydrogen fluoride solution to remove the natural oxide film, and then putting a wafer in an apparatus having a load lock chamber to form an HSG-Si film.

However, in the case where many wafers are put into a reaction chamber (formed of quartz, SiC or the like), which is evacuated by an vacuum pump and heated, through the load lock chamber, even when the natural oxide films on the wafers are temporarily removed by the hydrofluorination, it is confirmed that natural oxide films are formed on amorphous silicon again and impurities such as water, etc. remain in the heated reaction chamber. This is because when the wafers are put into the reaction chamber, water which is adsorbed at the inside of and on the surface of the silicon oxide film formed on the wafer is heated and separated from the silicon oxide film. If the number of wafers is small, the effect of water, oxygen and organic materials which are separated from an interlayer film, etc. is small. However, if many wafers are put into the reaction chamber, the amount of the impurities is increased, and thus it is difficult to keep the Si film surface clean. Particularly, the increase of the partial pressure of water has a strong effect on the formation of HSG. This is because the water separated from the silicon oxide film promotes oxidation of the electrode surface on the wafer.

As described above, it has been found that when the natural oxide film remains on amorphous silicon, silicon atoms do not sufficiently gather around the atoms serving as nucleuses even when silicon-contained gas is irradiated, and thus the surface area increase rate of the HSG-Si film has a limitation. This is because the natural oxide film disturbs the migration of silicon atoms on the surface of amorphous silicon. Further, once the electrode surface is oxidized, the surface area increase rate of the HSG-Si film is not enhanced even when the vacuum degree of the load lock chamber and an anneal chamber is set to about $1 \times 10^{-8}$ Torr by a turbo pump or the like.

Japanese Laid-open Patent Application No. Hei-5-206046 proposes that an impurities-capturing function is provided by a reactor core pipe itself which is used in a heat treatment step of a semiconductor manufacturing process. According to this technique, the reactor core pipe is formed of polysilicon, and a heat treatment which causes the impurities of polysilicon itself to gather at the upper end portion of the reactor core pipe is performed when the reactor core pipe is formed.

This publication does not indicate the problem that the surface area increase rate for the formation of the HSG-Si film has a limitation. Further, this publication does not suggest that the reactor core pipe is used to form the HSG-Si film.

Further, since the impurities capturing capability is provided to the reactor core pipe itself, even if the reactor core pipe of this publication is applied to form hemi-spherical grains, the capturing capability of the reactor core pipe is reduced due to adhesion of impurities every time the reactor core pipe is used. Therefore, it is required to exchange the reactor core pipe by a new one or treat the reactor core pipe at high temperature again. Accordingly, this reactor core pipe is unsuitable for repetitive use.

Next, referring to Japanese Laid-open Patent Application No. Hei-1-197388, this publication proposes that high-purity getter material which can adsorb and absorb residual impurities under vacuum is attached in a growth chamber of a molecular-beam crystal apparatus. In this publication, high-purity Al, Mn, Nd, Sc, Sm and Yb are suggested as the capture material. As described above, this publication indicates that metal capture material which is formed of Al or the like is suitable to capture residual impurities such as $H_2O$, $CO$, $CO_2$, etc.

However, such metal capture material is gasified and vaporized by a high-temperature heat treatment at 500° C. or more, and thus it is not applicable to a semiconductor device manufacturing process in which the overall reaction chamber is subjected to the high-temperature heat treatment. Further, the device characteristic is generally deteriorated if metal is attached to Si, and thus the metal capture material is unsuitable for the device manufacturing.

Actually, when the HSG-Si film is formed by the HSG technique, amorphous silicon is usually subjected to the heat treatment at, a high temperature of about 550° C. in an anneal chamber of an LPCVD apparatus (that is, a reaction chamber which is reduced in pressure and kept at high temperature) to be annealed, thereby forming an HSG-Si film. As described above, when the HSG-Si film is formed, the high-temperature heat treatment of about 550° C. is required, and thus the metal capture material as disclosed in the above publication is not usable as getter material in the HSG-Si film forming process.

SUMMARY OF THE INVENTION

An object of the present invention is to perfectly eliminate the effect of water, oxygen and organic materials which are separated from interlayer films even when many wafers are put in a chamber, thereby forming HSG-Si films uniformly and stably at high throughput.

Another object of the present invention is to provide a method of capturing gaseous impurities which is suitable to form HSG-Si films.

Another object of the present invention is to provide a semiconductor device manufacturing apparatus using capture material (material for capturing gaseous impurities) which is not vaporized even at high temperature of about 550° C.

Another object of the present invention is to provide a semiconductor device manufacturing apparatus using as capture material materials which do not deteriorate the device characteristic even when it comes into contact with a wafer.

The other object of the present invention is to provide a semiconductor device manufacturing apparatus using as capture material materials other than metal materials.

According to the present invention, there is achieved a gaseous impurities capturing method, comprising: coating a silicon film on the inner wall of a treatment system for performing a predetermined treatment before the predetermined treatment is performed, and capturing the gaseous impurities in the treatment system by the silicon film. The predetermined treatment is a treatment for forming an HSG-Si film, and use of the capturing method can eliminate a step of removing a natural oxide film with hydrofluoric acid or the like.

According to the present invention, there is provided a method for capturing gaseous impurities, characterized in that when a semiconductor wafer is fed into a treatment chamber to perform a predetermined treatment, a semiconductor film which is formed of the same kind of semiconductor as the semiconductor wafer is coated in the treatment chamber before the predetermined treatment is conducted, and then the semiconductor wafer is fed into the treatment chamber, whereby the gaseous impurities emitted from the semiconductor wafer are captured and removed by the semiconductor film. The semiconductor film may be a silicon film, germanium film, or the like. The silicon film may be coated by introducing silicon-based gas.

Further, according to the present invention, there is achieved a semiconductor device manufacturing apparatus including a treatment chamber defining a treatment space, which can be evacuated, wafer feeding means for feeding wafers to be treated into the treatment space, and means for introducing gas into the treatment space and forming on the inner wall of the treatment chamber a coating film which is determined by the gas before the wafers are fed into the treatment space. The coating film may be a phosphorus-doped HSG-Si film.

BRIEF DESCRIPTION OF THE DRAWINGS

FIG. 10A is a partially enlarged view showing a semiconductor device manufacturing apparatus according to a third embodiment of the present invention;

FIG. 10B is a plan view showing a part of FIG. 10A;

FIG. 10C is a plan view showing a modification of the part shown in FIG. 10B,

FIG. 11A is a diagram showing a modification of the semiconductor device manufacturing apparatus shown in FIG. 10A; and FIG. 11B is a plan view showing a part of FIG. 11A in detail.

DETAILED DESCRIPTION OF PREFERRED EMBODIMENTS

Preferred embodiments according to the present invention will be described hereunder with reference to the accompanying drawings.

Figure 1:
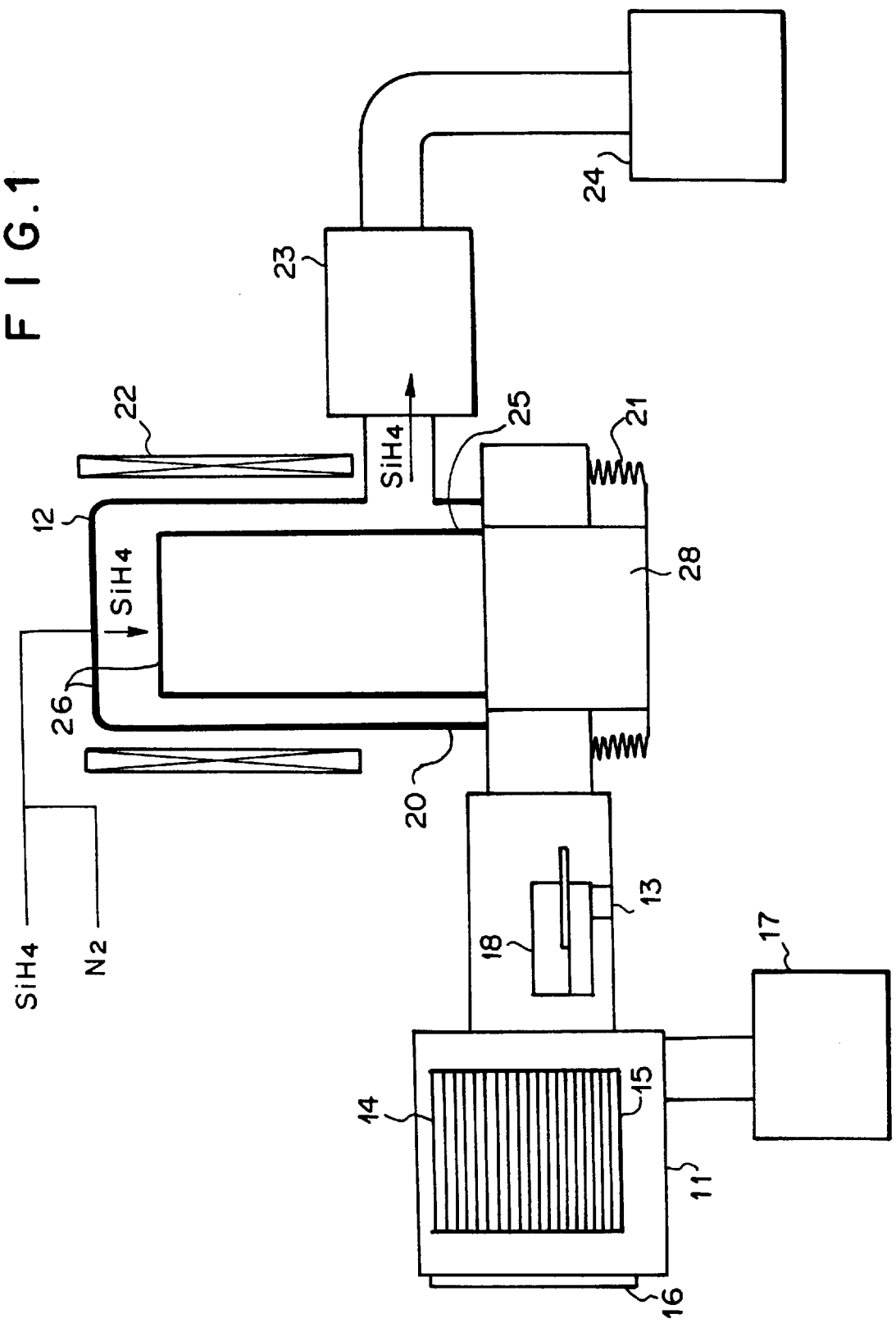
FIG. 1 is a diagram showing a process performed in a semiconductor device manufacturing apparatus according to a first embodiment of the present invention.

Referring to FIG. 1, a semiconductor device manufacturing apparatus according to a first embodiment of the present invention has a sample chamber 11, a reaction chamber 12 and a load lock chamber 13 which is kept under vacuum and disposed between the sample chamber 11 and the reaction chamber 12.

A cassette 15 in which plural wafers 14 such as silicon wafers or the like are accommodated is fed from the atmospheric air into the sample chamber 11 through a door 16 of the sample chamber 11. Here, it is assumed that each wafer 14 is formed with MOSFETs constituting a DRAM and an interlayer film of silicon oxide film group which is formed so as to cover the MOSFEs, and further an amorphous silicon film used for capacitors is formed on the interlayer film. Further, the sample chamber 11 is linked to a vacuum pump 17, and the sample chamber 11 is evacuated to such a vacuum level that the partial pressure of water is equal to $1 \times 10^{-6}$ Torr or less. In the sample chamber 11 may be performed a pre-treatment of removing a natural oxide film formed on amorphous silicon with hydrofluoric acid or the like.

The load lock chamber 13 which is linked to the sample chamber 11 through a gate valve (not shown) is provided with a wafer feeding robot 18, and wafers 14 accommodated in the cassette 15 of the sample chamber 11 are fed from the sample chamber 11 through the load lock chamber 13 to the reaction chamber 12 one by one.

The reaction chamber 12 has a chamber portion 20 formed of quartz, SiC or the like, and an air-insulating bellows portion 21 which is provided at the lower side of the chamber portion 20. The air insulating bellows portion 21 is designed to be extendable in the vertical direction in FIG. 1.

Further, a heater 22 which is formed of a coil is provided at the outside of the reaction chamber 12, and the reaction chamber 12 is evacuated by a vacuum pump 23 and an auxiliary vacuum pump 24. In addition, a wafer mount boat 25 in which plural wafers 14 can be accommodated is located on a mount table 28 in the reaction chamber 12, and an introducing pipe for introducing silicon-contained gas such as silane ($SiH_4$) or the like and inert gas such as $N_2$ or the like is connected to the reaction chamber 12.

Before the wafer 14 fed by the wafer feeding robot 18 is put into the reaction chamber 12, silicon-contained gas is introduced into the reaction chamber 12. At this time, the reaction chamber 12 is kept, at a temperature above the decomposition temperature of the silicon-contained gas, for example, 600° C. However, the silicon-contained gas may be introduced at the temperature for the HSG formation.

Under this atmosphere, the silicon-contained gas stays on the inner wall of the chamber portion 20 of the reaction chamber 12 and on the outer wall of the wafer mount boat 25 in the form of a silicon film, and a silicon film 26 is finally formed on the inner wall of the reaction chamber 12 and the boat 25 as indicated by bold lines of FIG. 1. With this process, the reaction chamber 12 and the boat 25 are pre-coated by the silicon film 26. During this pre-coat process, water, oxygen and organic materials in the reaction chamber are captured into the silicon film 26. In this case, the reaction chamber 12 is evacuated by the vacuum pump 23 and the auxiliary vacuum pump 24 during the pre-coat process of the silicon film 26, so that excessive silicon-contained gas is exhausted from the reaction chamber 12. Further, the evacuation of the reaction chamber 12 is carried out after the pre-coat of the silicon film 26, and the inside of the reaction chamber 12 is kept at a vacuum degree of about $1 \times 10^8$ Torr.

Figure 2:
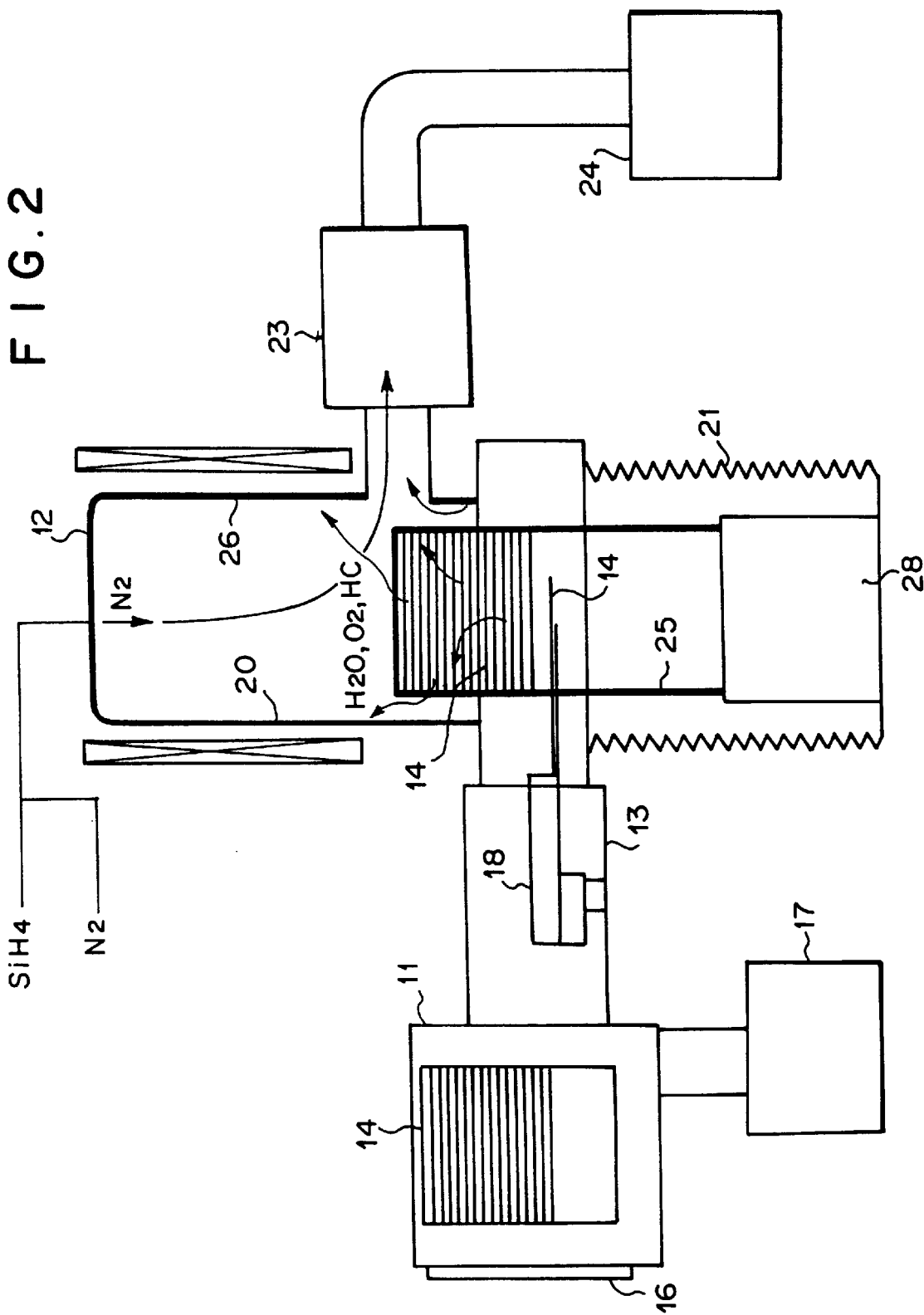
FIG. 2 is a diagram showing another process performed in the semiconductor device manufacturing apparatus shown in FIG. 1.

When the silicon film 26 is pre-coated to the inside of the reaction chamber 12 and the wafer mount boat 25, as shown in FIG. 2 the insulating bellows portion 21 of the reaction chamber 12 is extended to the lower side of FIG. 2. Therefore, the wafer mount boat 25 is moved downwardly together with the mount table 28 in FIG. 2. In this state, the wafer mount boat 25 is put to the position at which the wafer 14 can be mounted on the wafer mount boat 25.

Subsequently, the gate valve (not shown) between the load lock chamber 13 and the reaction chamber 12 is opened, and the wafer 14 mounted on the wafer feeding robot 18 is fed to and supported by the wafer mount boat 20. Here, impurities such as oxygen, water, hydrocarbon (HC), organic materials, etc. are unavoidably attached to the wafer 14 which is fed from the sample chamber 11 through the load lock chamber 13 even when the wafer 14 is subjected to the hydrofluorination treatment in the sample chamber 11 or the wafer 14 is subjected to the hydrofluorination treatment before it is put in the sample chamber 11, and these impurities could not be removed even if the vacuum degree in the sample chamber 11 and the load lock chamber 13 is increased.

As described above, the wafer 14 to which the impurities are attached is guided to the chamber portion 20 of the reaction chamber 12 which is pre-coated with the silicon film 26, and subsequently mounted in the wafer mount boat 25 which is likewise pre-coated with the silicon film 26. Nitrogen gas $N_2$ is introduced as inert gas into the reaction chamber 12, and the reaction chamber 12 is evacuated by the vacuum pump 23 and the auxiliary vacuum pump 24 while kept at a temperature of 550° C. or more. At this time, the $N_2$ gas is not reacted with the pre-coated silicon film, and thus it is not captured by the wafer.

The impurities which are attached onto the wafer 14 are partially exhausted and removed by the vacuum pump 23 and the auxiliary vacuum pump 24. Further, since the reaction chamber 12 is kept at 550° C. as described above, the wafer mount boat 25 is heated up to about 300° C. even when it is moved downwardly. When the wafer is mounted on the wafer mount boat 25 at this temperature, the impurities adsorbed on the wafer 14 are partially separated, and finally captured by the silicon-coated portion or removed by the evacuation pump.

Accordingly, the impurities such as oxygen, water, etc. are removed from the amorphous silicon surface of the wafer 14 and the interlayer films around the electrodes thereof, so that the amorphous silicon surface is kept clean and thus the formation of the natural oxide film can be prevented.

Figure 3:
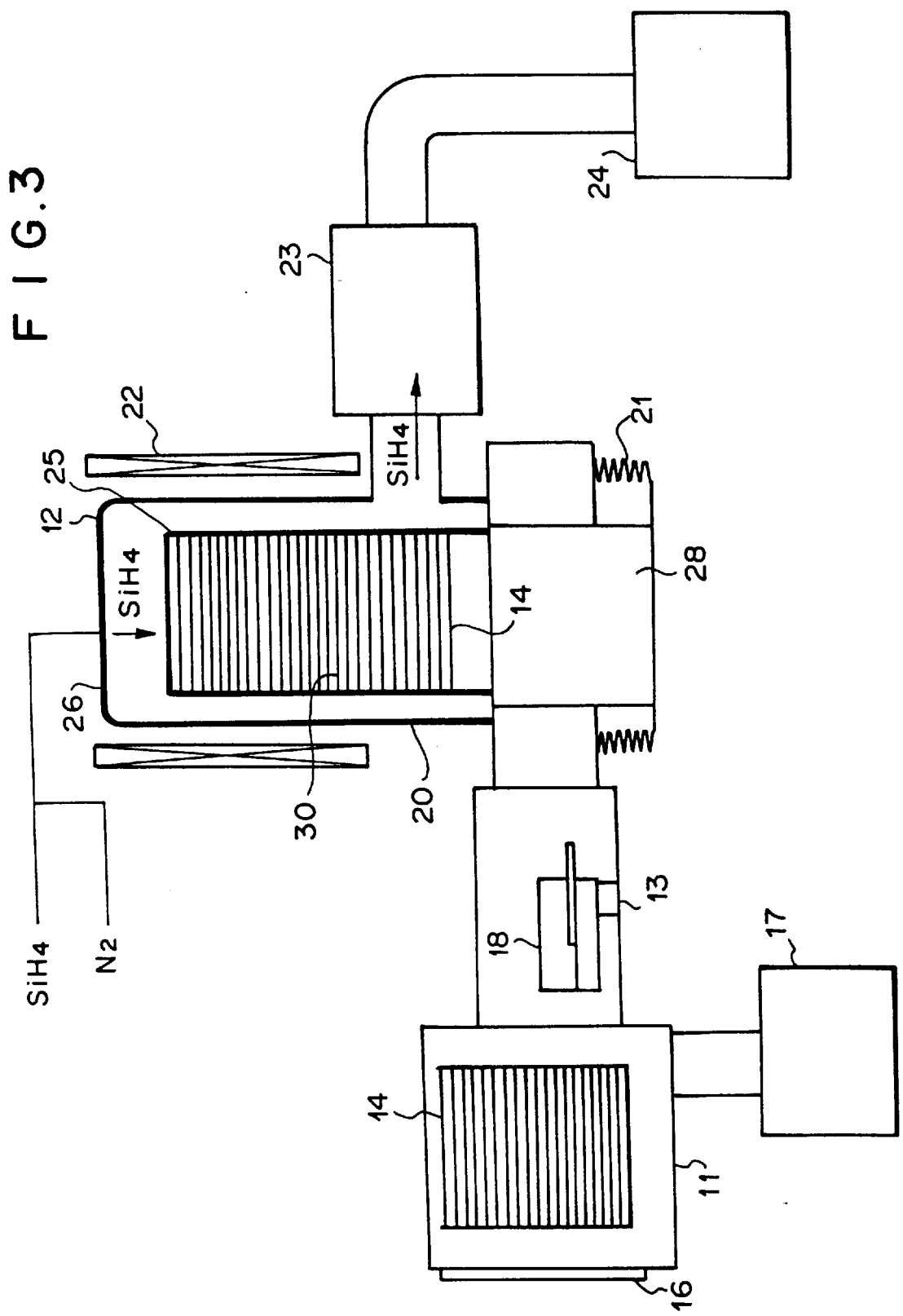
FIG. 3 is a diagram showing another process performed in the semiconductor device manufacturing apparatus shown in FIG. 1.

As described above, when the impurities on the wafer 14 are partially removed in the manner shown in FIG. 2, as shown in FIG. 3 the bellows portion 21 of the reaction chamber 12 is contracted and the wafer mount boat 25 is moved upwardly together with a predetermined number of wafers 14 mounted on the boat 25 and the mount table 28. Further, the impurities which are not separated when the wafer 14 is mounted on the wafer mount boat are heated and thus vaporized when the wafer is put into the reaction chamber 12 which is kept at 550° C., so that the impurities are adsorbed and captured by the silicon film 26 which is coated on the chamber portion 20 and the wafer mount boat 25.

By irradiating silane gas as silicon-contained gas to each wafer 14 mounted in the wafer mount boat 25 in the state shown in FIG. 3 and annealing each wafer 14 continuously, the nucleuses comprising silicon atoms are formed on an amorphous silicon electrode on each wafer 14. Since the clean phosphorus-doped amorphous silicon surface from which the impurities are removed is formed on each wafer 14 as described above, the silane gas is decomposed on the surface, and a silicon film is deposited on the surface. Since the concentration of phosphorus in the deposited silicon film is low, the silicon atoms readily migrate and thus form nucleuses. Grains can be grown around the nucleuses. After the irradiation of silane, the reaction chamber 12 is kept at temperature of 550° C. and at a vacuum degree of $1 \times 10^8$ Torr. Each wafer 14 is kept under the above atmosphere for 30 minutes. The silane gas is introduced at a flow rate of 15 SCCM.

The pre-coat of the silicon film 26 as described above may be performed every time the HSG-Si film is formed, or it may be performed when the formation of the HSG-Si film is performed at predetermined number of times, and the impurities capturing capability of the silicon film 26 is reduced.

Figure 4:
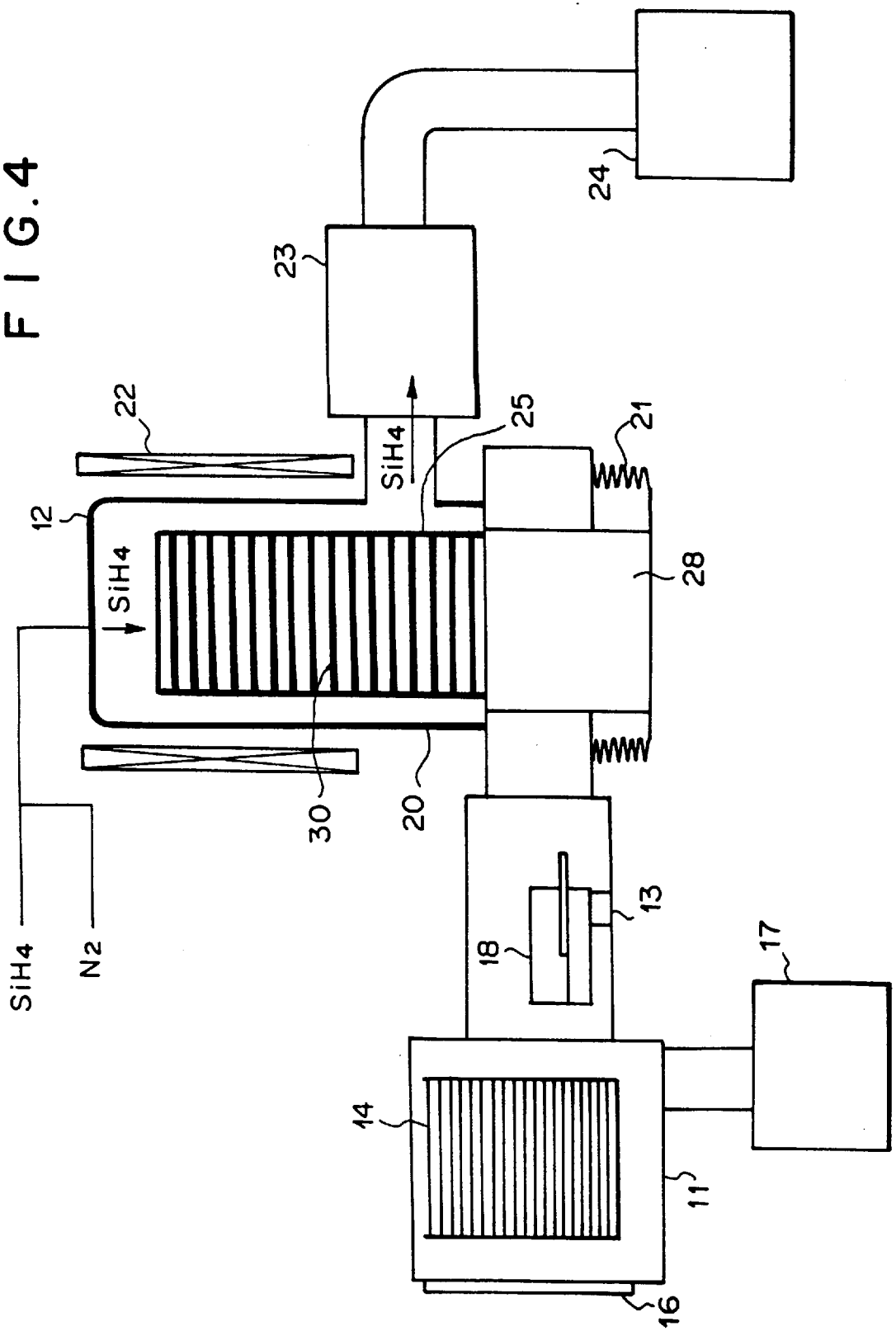
FIG. 4 is a diagram showing a process performed in a semiconductor device manufacturing apparatus according to a second embodiment of the present invention.

Referring to FIG. 4, in a semiconductor device manufacturing apparatus according to a second embodiment of the present invention, plural dummy wafers 30 are arranged at a predetermined interval in the vertical direction to the wafer mount boat 25 disposed in the reaction chamber 12. Each of the dummy wafers 30 is formed of silicon, quartz or silicon carbide (SiC), and the dummy wafers 30 are arranged in the boat 25 at such an interval that each wafer 14 (not shown in FIG. 4) can be interposed between the neighboring dummy wafers 30.

In FIG. 4, the boat 25 is upwardly moved in FIG. 4 by contracting the insulating bellows portion 21 in the same manner as shown in FIG. 1 before each of the wafers 14 is arranged between the dummy wafers 30. In this state, the inside of the reaction chamber 12 is heated up to 530° C., and subsequently silane ($SiH_4$) is irradiated as the silicon-contained gas into the reaction chamber 12. The irradiated silane is decomposed at the above temperature, and deposited as silicon films 26 on the inner wall of the chamber portion 20 of the reaction chamber 12, in the boat 25 and on both the upper and lower surfaces of the dummy wafers 30 in the boat 25.

Figure 5:
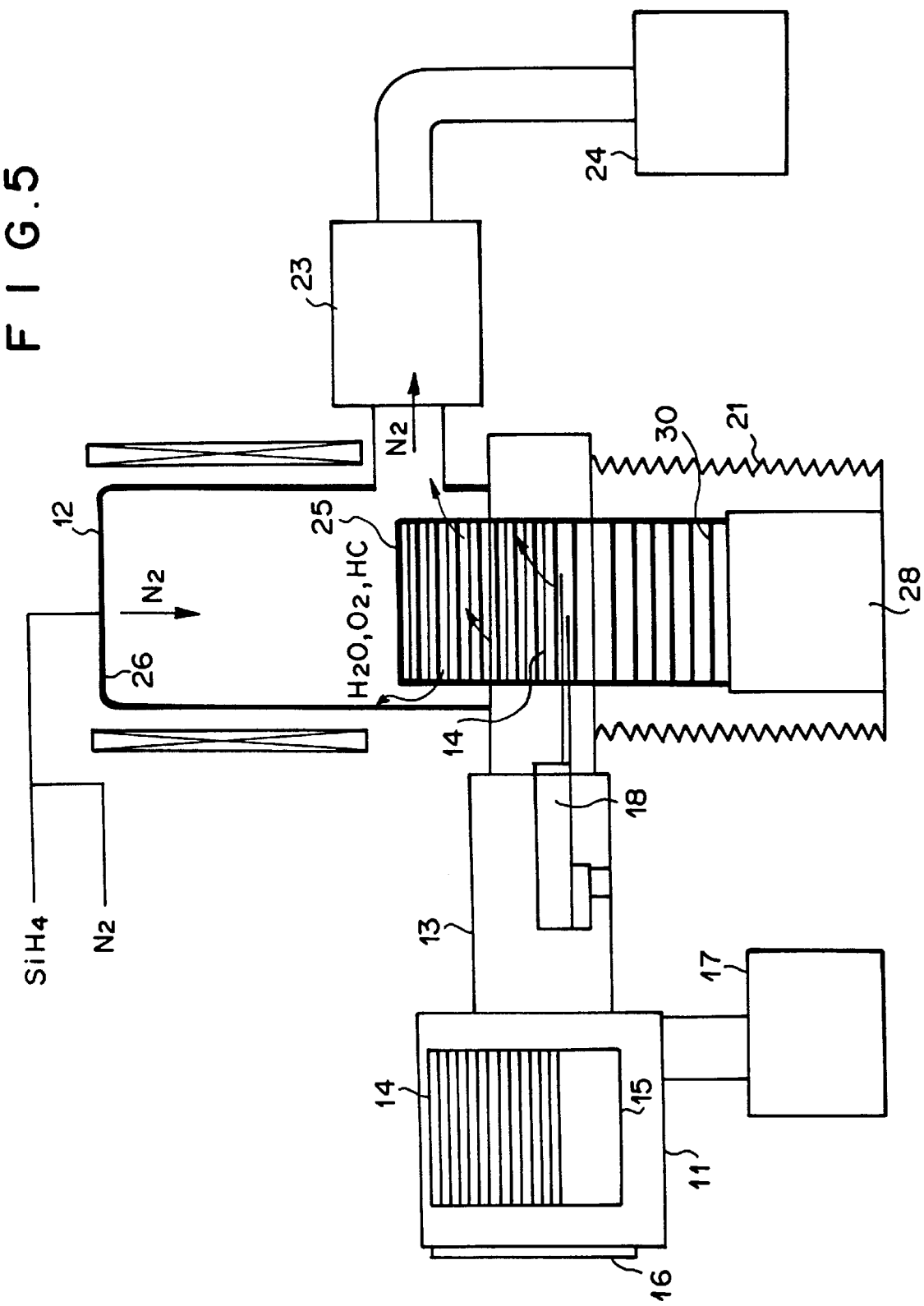
FIG. 5 is a diagram showing another process performed in the embodiment of the semiconductor device manufacturing apparatus shown in FIG. 4.

When the silicon films 26 are formed in the reaction chamber 12 and the boat 25 and on the dummy wafers 30 as described above, the irradiation of silane is stopped and the vacuum pump 23 and the auxiliary pump 24 are operated to keep the inside of the reaction chamber 12 in a vacuum state. Further as shown in FIG. 5, nitrogen gas $N_2$ is introduced as inert gas into the reaction chamber 12. $N_2$ is not reacted with the pre-coated silicon film as described above. At this time, as shown in FIG. 5, the bellows portion 21 of the reaction chamber 12 is extended to downwardly move the boat, 25 together with the mount table 28 and the dummy wafers 30. Each of the wafers 14 is successively disposed in the gap between the neighboring dummy wafers 30 provided to the boat 25 in the reaction chamber 12 from the wafer feeding robot 18 in the load lock chamber 13 in the state that the boat 25 is downwardly moved. In this case, the insulating bellows portion 21 is successively contracted from the lowermost portion to the upper side to upwardly move the boat 25 together with the mount table 28 every time the wafer 14 is disposed between the dummy wafers 30. Therefore, the wafers 14 is successively arranged between the dummy wafers 30 from the uppermost portion of the boat 25 to the lower side.

As in the case of the first embodiment, the reaction chamber 12 is kept at about 550° C., and nitrogen gas is introduced as inert gas into the reaction chamber 12. Accordingly, the wafers which are fed by the boat 25 are gradually heated. Simultaneously with the introduction of the inert gas, the reaction chamber 12 is evacuated by the vacuum pump 23 and the auxiliary vacuum pump 24.

In this case, the respective wafers 14 arranged in the boat 25 are kept to be spaced from the neighboring dummy wafers 30 at certain intervals, and each of the dummy wafers 30 is covered by the silicon film which can adsorb and capture the impurities such as water, oxygen, hydrocarbon (HC), etc. In this embodiment, the wafers 14 are successively set from the upper side of the boat 25. However, the wafers 14 may be set from the lower side of the boat 25. This is because just when the dummy wafer 30 is picked up from the reactor core pipe, it is still heated and thus has an effect, of removing the impurities attached to the wafer 14.

Figure 6:
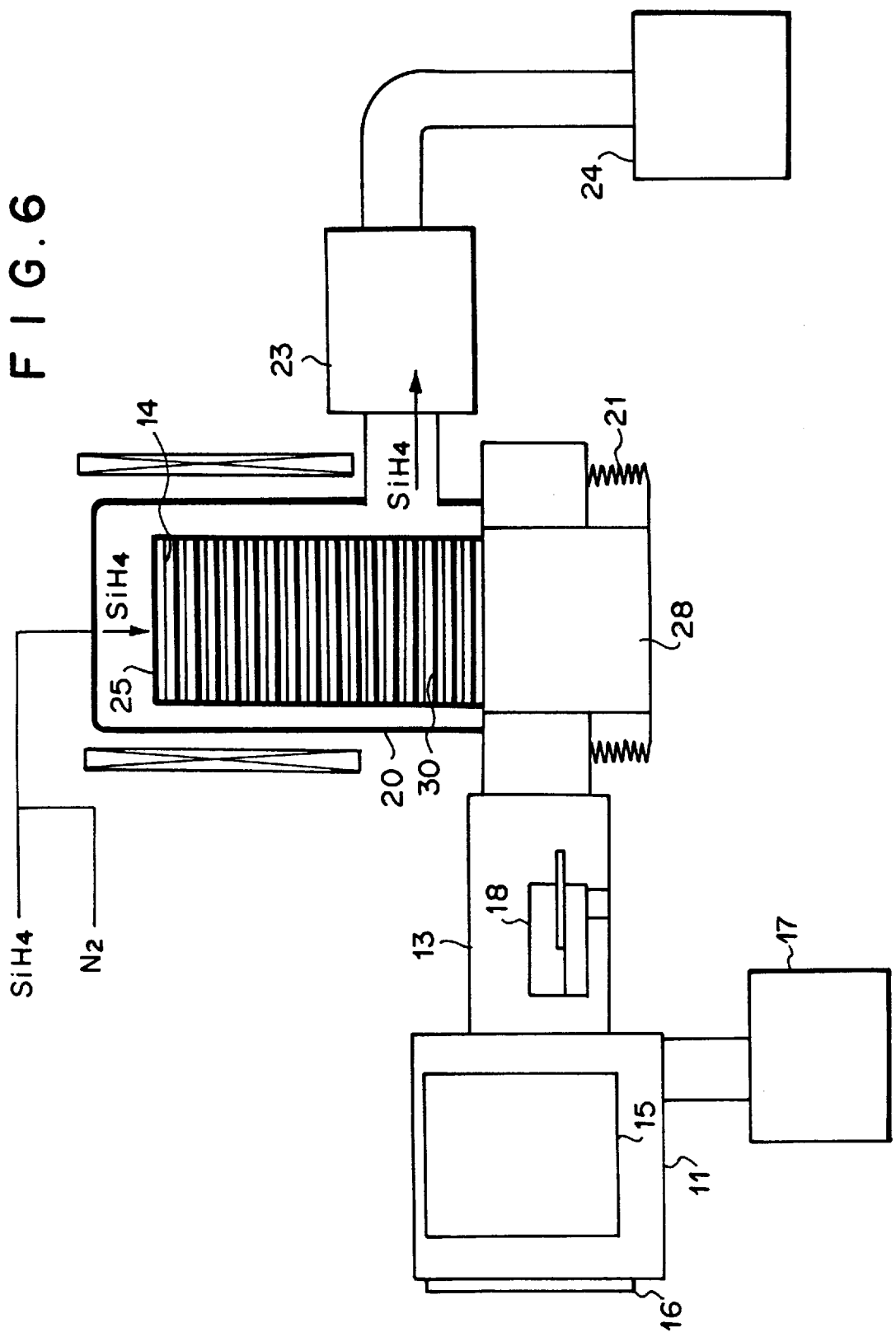
FIG. 6 is a diagram showing another process performed in the embodiment of the semiconductor device manufacturing apparatus shown in FIG. 4.

When all the wafers 14 set in the cassette 15 of the sample chamber 11 are fed into the boat 25 of the reaction chamber 12 by the wafer feeding robot 18 in the load lock chamber 13, the boat 25 is disposed at the highest position in the chamber portion 20 of the reaction chamber 25 by the contraction of the bellows portion 21 as shown in FIG. 6. As is apparent from FIG. 6, each wafer 14 in the boat 25 is perfectly surrounded by the dummy wafers 30 and the boat 25 which are pre-coated with the silicon films 26.

Further, the interval between each wafer 14 and the neighboring dummy wafers 30 is set to be extremely shorter than the interval between the wafer 14 and the silicon film 26 in the first embodiment. Further, the area of a portion which can capture the impurities is increased. Accordingly, according to the second embodiment, as compared with the first embodiment, the impurities on the wafers 14 can be more efficiently removed by the silicon films 26, and thus the surface of each wafer 14 can be kept clean. Therefore, the natural oxide film is hardly formed on the surface of the wafer 14, and no contamination occurs.

In this state, the introduction of the nitrogen gas as inert gas into the reaction chamber 12 is stopped, and the reaction chamber 12 is evacuated by the vacuum pump 23 and the auxiliary vacuum pump 24 until the vacuum degree is equal to a predetermined value, for example, $1 \times 10^8$ Torr.

First, the reaction chamber 12 is heated up to about 560° C. Subsequently, silane gas ($SiH_4$) is introduced into the reaction chamber 12 as shown in FIG. 6. As a result, silicon atoms are efficiently attached onto amorphous silicon on each wafer 14 which is cleaned in a step shown in FIG. 5, and an HSG-Si film having large roughness can be formed.

Figure 7:
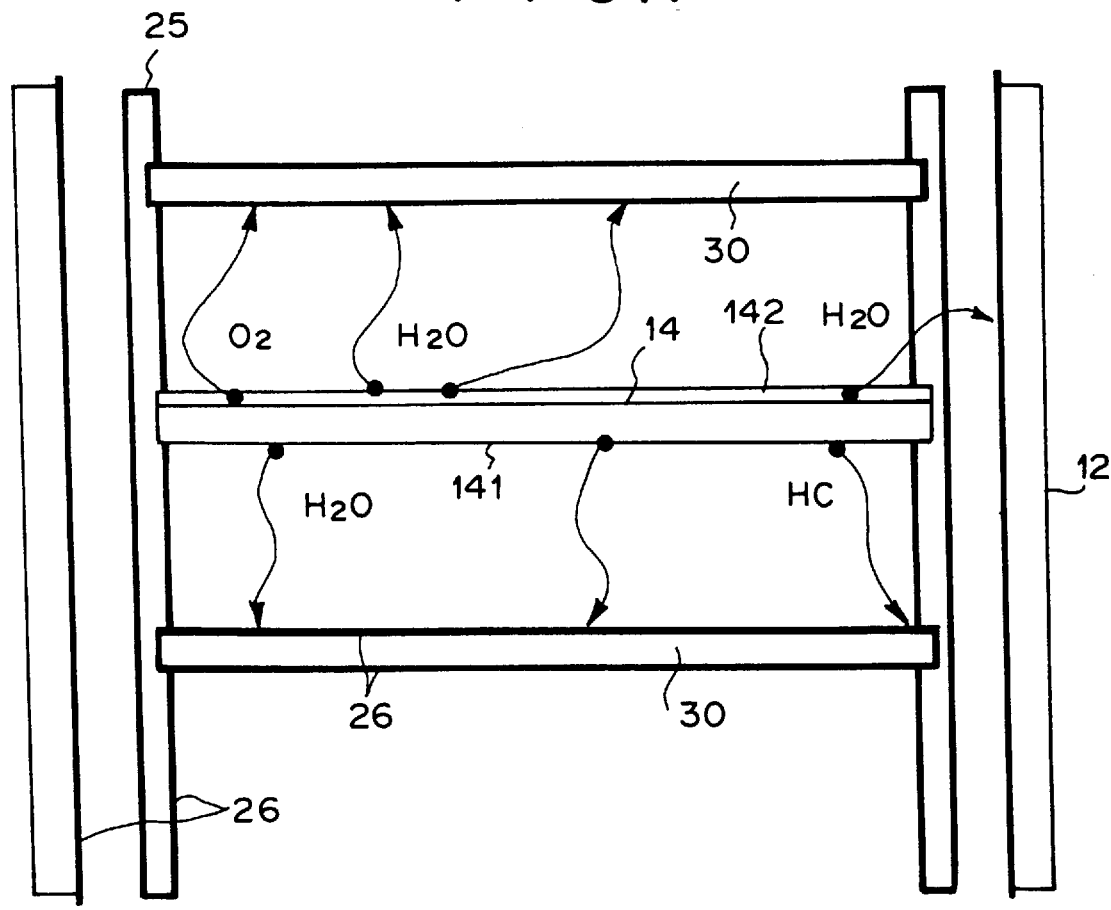
FIG. 7 is a partially enlarged view showing the operation of the semiconductor device manufacturing apparatus shown in FIGS. 4 to 6.

FIG. 7 is an enlarged view showing the state of the wafer 14 shown in FIG. 6. The wafer mount boat 25 is located in the reaction chamber 12. Further, the dummy wafers 30 formed of quartz, SiC or the like are arranged at intervals in the wafer mount boat 25. As indicated by bold lines in FIG. 7, the silicon films 26 serving as capturer for water, oxygen, HC, etc. are formed and attached on the inner surface of the reaction chamber 12, the surface of the wafer mount boat 25 and the surfaces of the dummy wafers 30 before the wafers 14 are mounted in the boat 25.

In FIG. 7, each wafer 14 is disposed in the gap between neighboring dummy wafers 30 after the silicon films 26 are formed. The wafer 14 shown in FIG. 7 has a semiconductor substrate 141 and a device layer 142 formed on the surface of the semiconductor substrate 141, and an interlayer film is formed together with MOSFETs, etc. in the device layer 142. In this case, impurities such as water ($H_2O$), oxygen ($O_2$), hydrocarbon (HC), etc. are attached onto the device layer 142 and the semiconductor substrate 141 when the wafer 14 is passed through the sample chamber 11 and the load lock chamber 13.

When the wafer 14 is disposed between the dummy wafers 30 of the reaction chamber 12 which is kept at high temperature in the above state, water and oxygen in the device later 142 are vaporized and captured by the silicon films 26 which are formed on the dummy wafers 30 located at the upper side of the wafer 14. In addition, these impurities are partially captured by the silicon film 26 on the inner wall of the reaction chamber 12. Further, impurities such as water, hydrocarbon (HC), etc. are vaporized from the back surface of the wafer 14, and captured by the silicon films 26 on the dummy wafers 30 located at the lower side of the wafer 14 and on the inner wall of the reaction chamber 12.

In the embodiment shown in FIG. 7, since the interval between the obverse surface and the back surface of the wafer 14 and the silicon film 26 serving as capturer is set to be extremely short, natural oxide films and contamination films can be efficiently prevented from being formed on the obverse and back surfaces of the wafer 14 as described above.

Figure 8:
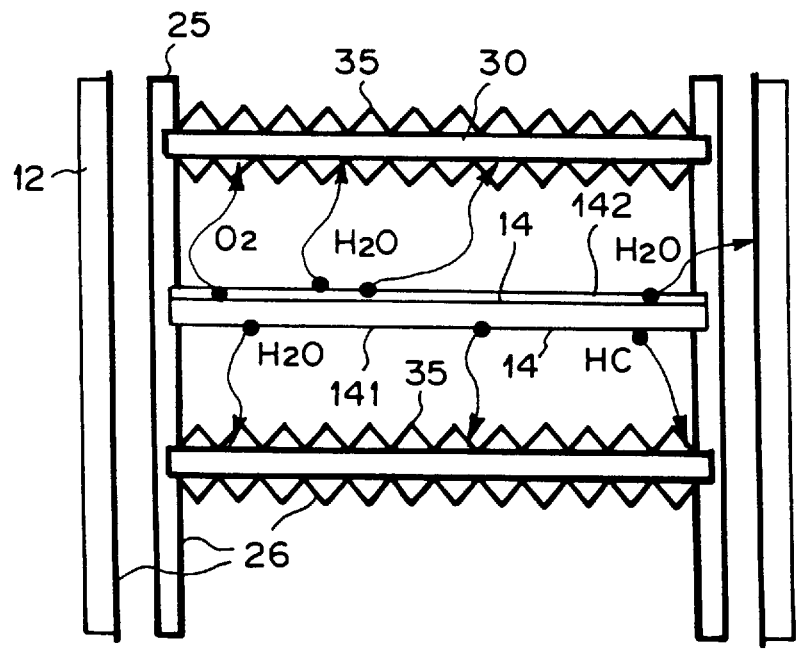
FIG. 8 is a diagram showing a modification of the part shown in FIG. 7.

FIG. 8 shows a modification of the semiconductor device manufacturing apparatus shown in FIG. 7. This modification is different from the embodiment of FIG. 7 in that a silicon film 35 having a roughened surface is formed on each of the obverse and back surfaces of the dummy wafer 30. By providing the silicon film 35 with the roughened surfaces as shown in FIG. 8, the surface area of the silicon film 35 can be increased, so that the capturing capability of the silicon film 35 can be enhanced. Accordingly, in the semiconductor device manufacturing apparatus according to this modification, the impurities from the wafer 14 can be more efficiently captured as compared with the embodiment shown in FIG. 7.

Further, in order to form a silicon film 35 having a roughened surface, the following method may be adopted. That is, a dummy wafer 30 is formed of silicon, and silicon-contained gas such as silane or the like is irradiated to the surface of the silicon dummy wafer 30 and HSG-Si film is formed by a well-known HSG technique. Since the enlargement of the area due to the formation of the roughened surface of the dummy wafer 30 may be smaller than the HSG-Si film formed on the wafer 14, the impurities may be attached onto the dummy wafer 30. Further, there may be used another method in which the dummy wafer 30 itself is processed to form an uneven portion on the surface of the dummy wafer 30 and then an Si film is deposited on the uneven portion.

Figure 9:
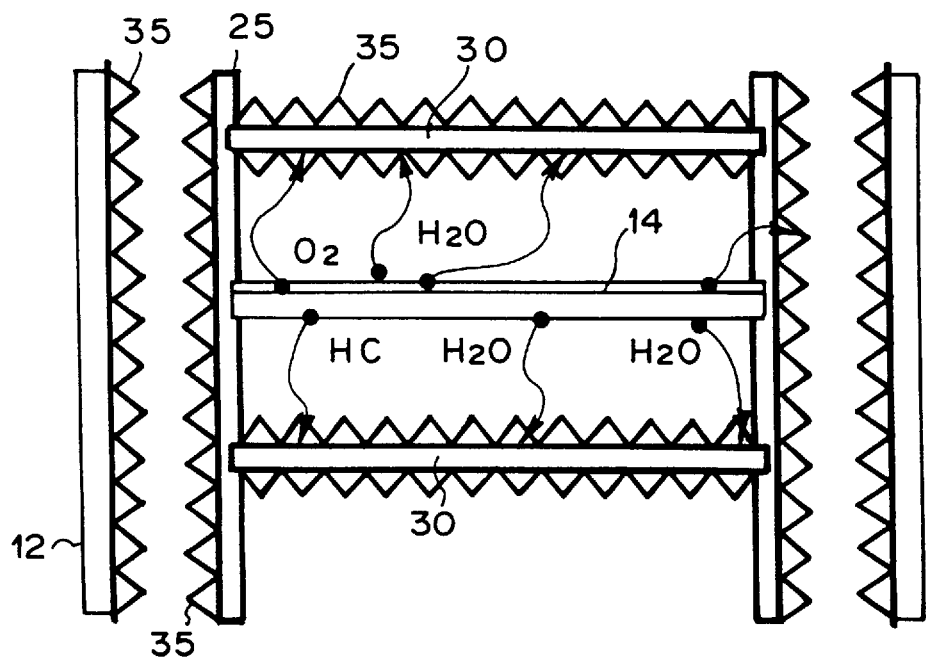
FIG. 9 is a diagram showing another modification of the part shown in FIG. 7.

FIG. 9 shows another modification of FIG. 7. In FIG. 9, a silicon film 35 having an uneven portion is formed not only on the dummy wafer 30, but also on the inner wall of the reaction chamber 12 and the surface of the boat 25, whereby the area of the silicon film 35 for capturing the impurities can be further increased. As described above, the silicon film 35 having the roughened surface can be formed in the reaction chamber 12 and the boat 25 by a well-known method, and thus the detailed description thereof is omitted from the description.

Referring to FIGS. 10A and 10B, the semiconductor device manufacturing apparatus according to the third embodiment of the present invention will be described. As shown in FIG. 10B, this embodiment has a wafer holder having a circular dummy wafer 36 which is partially cut out and three wafer holding bars 37 which stand on the dummy wafer 36. The dummy wafer 36 and the holding bars 37 are formed of silicon, quartz, SiC or the like, and as in the case of the above-described embodiment, the surfaces of the dummy wafer 36 and the holding bars 37 are coated with silicon films.

As described above, by using the partially cut-out dummy wafer 36, the dummy wafer 36 can be more easily positioned in the boat 25.

In this construction, each wafer 14 which is fed from the load lock chamber 13 (see FIG. 6) to the reaction chamber 12 is mounted onto the holding bar 37 of the wafer holder by the wafer feeding robot 18. When the wafer 14 is mounted on the holding bar 37, the device layer 142 of each wafer 14 is not brought into direct contact with the dummy wafer 36, and thus contamination, etc. of the device layer 142 due to the contact can be prevented.

FIG. 10C shows a modification of the dummy wafer 36 which is usable for the embodiment. of FIG. 10A. In this modification, a circular dummy wafer 36 is provided, and three holding bars 37 are provided on the dummy wafer 36. The wafer holder shown in FIG. 10C is also usable in the same manner as that of FIG. 10B. In FIGS. 10B and 10C, the number of the holding bars 37 is set, to 3, however, the number of the holding bars 37 is not limited to 3. Further, means for preventing slippage of the wafer may be provided on the dummy wafer 36.

In FIGS. 10A to 10C, an uneven portion may be formed on the silicon film 26 serving as getter as in the case of FIGS. 8 and 9.

FIGS. 11A and 11B show another modification of the dummy wafer 38 of the present invention. As shown in FIG. 11B, the dummy wafer 38 is provided with a notch portion 39 through which the arm of the wafer feeding robot 18 is inserted. As in the case of the other modifications, the silicon film 26 is formed on the dummy wafer 38 shown in FIGS. 11A and 11B. Further, as shown in FIG. 11A, the wafer 14 is directly mounted on the dummy wafer 38 by the wafer feeding robot 18. In this modification, the silicon films 26 are formed on the surfaces of the reaction chamber 12 and the boat 25, and an uneven portion may be provided on the silicon films 26.

Next, an effect when the silicon film 26 is beforehand formed in the reaction chamber 12 and then the HSG-Si film is formed, as in the case of the semiconductor device manufacturing apparatus according to the present invention, will be described with reference to table 1.

First, one phosphorus-doped amorphous silicon substrate which had a clean surface with no natural oxide film and was used to form HSG, and one silicon substrate which had a clean surface with no natural oxide film and was used to measure the thickness of the oxide film were prepared, and forty eight silicon substrates (wafers) on which no natural oxide film was formed were prepared. These samples were fed into the sample chamber 11, and then fed to the reaction chamber 12. As shown on the first column of the table 1, when the reaction chamber 12 was not pre-coated, a silicon oxide film of 3 angstroms in thickness was formed on amorphous silicon. At this time, the surface area after the HSG-Si film was formed was equal to 1.7 time of the surface area of amorphous silicon (i.e. the surface area increase rate was equal to 1.7). On the other hand, when the reaction chamber 12 was pre-coated with the silicon film 26 and any insulating plate such as a dummy wafer was not provided between the silicon substrates as shown in FIG. 1, no silicon oxide film was formed on the silicon substrate fed to the reaction chamber 12, and the surface area increase rate after the HSG treatment was equal to 2.2. Further, when the silicon films were formed in the reaction chamber 12 and on the insulating plate such as a dummy wafer, no silicon oxide film was formed on the silicon substrate fed to the reaction chamber 12, and the surface area increase rate after the HSG-Si treatment was equal to 2.2.

Next, when a natural oxide film of about 4 angstroms in thickness was formed on each of 48 silicon substrates which were fed into the sample chamber 11, when the reaction chamber was not pre-coated, the thickness of a silicon oxide film which was grown on a silicon substrate having a clean surface was equal to 5 angstroms, and the surface area increase rate was fixed to 1.5 when the HSG-Si film was formed in the reaction chamber.

On the other hand, when the reaction chamber or both the reaction chamber and the insulating plate were pre-coated, no silicon oxide film was formed on the silicon substrate fed into the reaction chamber, and the surface area increase rate after the HSG-Si film treatment was equal to 2.2.

the like. The semiconductor film can remove organic materials such as volatile solvent or the like.

What is claimed is:

1. A method for capturing gaseous impurities, comprising steps of:
    coating a silicon film onto an inner wall of a chamber in which a hemispherical grain silicon film is deposited on a silicon wafer, by introducing a silicon-based gas into the chamber;
    feeding the silicon wafer into the chamber;
    reducing the pressure in the chamber to substantially less than 0.01 Torr to cause the silicon wafer to emit the gaseous impurities;
    depositing the hemispherical grain silicon film on the silicon wafer under the reduced pressure; and
    capturing, by the silicon film on the inner wall of the chamber, gaseous impurities emitted by the silicon wafer as a result of the reduced pressure.

TABLE 1

| WAFERS INTRODUCED SIMULTANEOUSLY WITH EACH OF ONE HSG-FORMING PHOSPHORUS-DOPED AMORPHOUS SILICON SUBSTRATE AND ONE OXIDE-FILM THICKNESS MEASURING SILICON SUBSTRATE | | SILICON SUBSTRATE: 48 NO NATURAL OXIDE FILM | SILICON SUBSTRATE: 48 WITH NATURAL OXIDE FILM |
|---|---|---|---|
| THICKNESS OF SILICON OXIDE FILM | NO PRE-COAT | 3 Å | 5 Å |
| | PRE-COAT AND NO INSULATING PLATE | — | — |
| | PRE-COAT AND INSULATING PLATE | — | — |
| SURFACE AREA INCREASE RATE BASED ON HSG FORMATION | NO PRE-COAT | 1.7 | 1.5 |
| | PRE-COAT AND NO INSULATING PLATE | 2.2 | 2.2 |
| | PRE-COAT AND INSULATING PLATE | 2.2 | 2.2 |

(Note)
THICKNESS OF SILICON OXIDE FILM AND SURFACE AREA INCREASE RATE BASED ON HSG FORMATION ARE AVERAGE VALUES ON WAFER SURFACE As described above, according to the present invention, the treatment chamber such as the reaction chamber or the like is beforehand pre-coated with a silicon film before a predetermined treatment is performed on a wafer, whereby the impurities on the wafer are captured by the silicon film to clean the surface of the wafer. As a result, the surface area increase rate of the HSG-Si film which will be subsequently formed can be enhanced. further, the pre-coat treatment can be performed without exchanging the treatment chamber such as the reaction chamber or the like, so that the present invention is very effective economically.

In the present invention, the silicon-based gas may be disilane gas, trisilane gas, tetrasilane gas, $SiCl_4$, $SiHCl_3$, $SiH_2Cl_2$ or the like. The semiconductor film may be a germanium film when the semiconductor wafer is a germanium wafer. The semiconductor film may be a compound semiconductor film such as an InAlAs film, InGaAs film, or the like when the semiconductor wafer is a compound semiconductor wafer such as an InAlAs wafer, InGaAs wafer, or the like.

According to the present invention, the semiconductor film can remove acidic or alkaline impurities such as an oxide of nitrogen (e.g. $NO_2$, NO), an oxide of sulfur (e.g. $SO_2$), an oxide of carbon (e.g. $CO_2$, CO), ammonia ($NH_3$) or 2. A method for capturing gaseous impurities according to claim 1 wherein the silicon-based gas comprises one of silane gas, disilane gas, trisilane gas, and tetrasilane gas.

3. A method for capturing gaseous impurities according to claim 1 wherein the gaseous impurities comprise one of oxygen, water, and hydrocarbon.

4. A method for capturing gaseous impurities according to claim 1 wherein the hemispherical grain silicon film is deposited on the silicon wafer to form a capacitor thereon.

5. A method for capturing gaseous impurities according to claim 1, wherein the reduced pressure condition is a vacuum degree of $1 \times 10^{-8}$ Torr.

6. A method for capturing gaseous impurities according to claim 1, further comprising a step of locating a boat for mounting the silicon wafer thereon, the boat being coated with the silicon film when the inner wall of the chamber is coated with the silicon film.

7. A method for capturing gaseous impurities according to claim 6, further comprising a step of arranging a dummy wafer on the boat,
    wherein the step of coating a silicon film onto an inner wall of a chamber coats the dummy wafer with a silicon film.

* * * * *